United States Patent [19]
Cha et al.

[11] Patent Number: 5,940,343
[45] Date of Patent: Aug. 17, 1999

[54] MEMORY SUB-WORD LINE DRIVER OPERATED BY UNBOOSTED VOLTAGE

[75] Inventors: Gi-won Cha; Jei-hwan Yoo, both of Suwon; Hoon Choi, Seoul, all of Rep. of Korea

[73] Assignee: Samsung Electronics, Co., Ltd., Suwon, Rep. of Korea

[21] Appl. No.: 08/924,465

[22] Filed: Aug. 21, 1997

[30] Foreign Application Priority Data

Aug. 21, 1996 [KR] Rep. of Korea .................... 96-34764

[51] Int. Cl.⁶ .................................................. G11C 8/00
[52] U.S. Cl. .............................. 365/230.06; 365/189.09
[58] Field of Search ..................... 365/230.06, 230.08, 365/189.09, 189.11

[56] References Cited

U.S. PATENT DOCUMENTS

| | | | |
|---|---|---|---|
| 5,416,747 | 5/1995 | Ohira | 365/230.06 |
| 5,519,665 | 5/1996 | Chishiki | 365/230.06 |
| 5,652,731 | 7/1997 | Saeki | 365/230.06 |

*Primary Examiner*—Son Mai
*Attorney, Agent, or Firm*—Marger Johnson & McCollom, P.C.

[57] ABSTRACT

A semiconductor memory device includes a sub-wordline and a bit line connected to a memory cell, a sub-wordline driver for signaling the sub-wordline, and a main word decoder and a sub-word decoder, for selecting the sub-wordline driver in response to an external input address signal, wherein the wordline driver includes an NMOS transistor switch connected between a main wordline which is an output of the main word decoder and the sub-wordline, and wherein the logic "high" voltage level of a first control signal which controls the switch is lower than that of a signal output to the sub-wordline. The semiconductor memory device having the sub-wordline driver allows the internal power supply voltage to be used as the power supply voltage of the main word decoder. Accordingly, the reliability of a gate oxide film of a transistor constituting the main word decoder is improved, which lengthens the life of the semiconductor memory device.

15 Claims, 6 Drawing Sheets

5,940,343

MEMORY SUB-WORD LINE DRIVER OPERATED BY UNBOOSTED VOLTAGE

BACKGROUND OF THE INVENTION

This application corresponds to Korean patent application No. 34764/1996 filed Aug. 21, 1996 in the name of Samsung Electronics Co., Ltd. which is herein incorporated by reference for all purposes.

1. Field of the Invention

The present invention relates to a semiconductor memory device, and more particularly, to a semiconductor memory device having a sub-wordline driver for transmitting an enable voltage to a wordline in response to an output signal of a main word decoder as a row decoder.

2. Description of the Related Art

A semiconductor memory device includes a memory cell array comprised of a plurality of memory cells connected between a plurality of wordlines and a plurality of bitline pairs, and peripheral circuits for inputting/outputting data stored in the memory cells. The respective addresses are designated to the wordlines and bitline pairs connected to the memory cells, respectively. Input addresses are decoded by a row decoder and a column decoder to select a specific wordline and bit line pair.

Particularly, a memory cell for a dynamic random access memory (DRAM) is composed of a transistor and a capacitor. The transistor is called an access transistor and the capacitor is called a storage capacitor. The capacitor is means for storing data, and the transistor is means for controlling the input/output of the data stored in the capacitor. The gate of the transistor is connected to a wordline, one end of the transistor is connected to a bitline, and the other end thereof is connected to one end of the capacitor.

When data of a logic "high" level is input/output to/from the capacitor of the memory cell, if a wordline enable voltage of a logic "high" level, i.e., an operating power supply voltage level, is applied to the wordline, a sufficient signal level might not be input/output to/from the capacitor of the memory cell due to a threshold voltage of the transistor. Therefore, it is common to supply a boosted voltage as the wordline enabling voltage to the wordline. A wordline driver is used to drive the boosted voltage.

Also, when the capacity of a semiconductor device is increased, the number of memory cells connected to a wordline is increased. As the wordline becomes longer, the load capacitance for the wordline is increased. Due to the increased load capacitance of the wordline, the speed loss becomes serious during enabling of the wordline, which impedes a high-speed access of the semiconductor memory device. To overcome this problem, the size of the wordline driver can be increased. However, it is quite difficult to increase the size of the circuits and elements in high-density integrated semiconductor devices. This is because the pitch between wordlines is shorter due to the small size in the design rule of the semiconductor memory device. Thus, it is very difficult to increase the size of the wordline driver.

Therefore, to solve the above-mentioned problems, the structure of a sub-wordline driver or split wordline driver (SWD) is adopted. However, the conventional semiconductor memory device having the sub-wordline driver structure must use a boosted voltage as the power supply voltage of the main word decoder. Accordingly, the boosted voltage is applied to a gate oxide film of a transistor constituting the main word decoder. The intensity of an electric field applied across the gate oxide film of the transistor is increased, which deteriorates the reliability of the gate oxide film.

SUMMARY OF THE INVENTION

Therefore, it is an object of the present invention to provide a semiconductor memory device having a sub-wordline driver which allows an internal power supply voltage, instead of a boosted voltage, to be used as the power supply voltage of a main word decoder.

The present invention is a semiconductor memory device comprising: a sub-wordline and a bit line connected to a memory cell; a sub-wordline driver for signaling the sub-wordline; and a main word decoder and a sub-word decoder, for selecting the sub-wordline driver in response to an external input address signal. The sub-wordline driver includes switching means connected between a main wordline which is an output of the main word decoder and the sub-wordline, and the logic "high" voltage level of a first control signal which controls the switching means is lower than that of a signal output to the sub-wordlines.

According to a preferred embodiment of the present invention, the switching means is an NMOS transistor whose gate is connected to the first control signal, and whose source and drain are connected to the main wordline and the sub-wordline, respectively. The logic "high" voltage level of the first control signal is equal to or lower than an internal power supply voltage level, and the level of the signal output to the sub-wordline is a boosted voltage level higher than the internal power supply voltage level. The first control signal is obtained by inverting the output signal of the sub-word decoder in an inverter having the interval power supply voltage as its power supply voltage.

Also, the sub-wordline driver further comprises: a first NMOS transistor whose source is connected to the output line of the main word decoder, and whose gate is connected to one of an external power supply voltage and an internal power supply voltage lower than the external power supply voltage; a second NMOS transistor whose source is connected to a second control signal, whose gate is connected to the drain of the first NMOS transistor and whose drain is connected to the sub-wordline; and a third NMOS transistor whose drain is connected to the sub-wordline, whose gate is connected to a third control signal and whose source is connected to a ground voltage.

The second control signal is obtained by inverting the output signal of the sub-word decoder in an inverter having a boosted voltage higher than the internal power supply voltage as its power supply voltage. The third control signal is obtained by inverting the second control signal in an inverter having the internal power supply voltage as its power supply voltage.

In the semiconductor memory device having the sub-wordline driver according to the present invention, the internal power supply voltage can be used as the power supply voltage of the main word decoder instead of a boosted voltage. Accordingly, the reliability of a gate oxide film of a transistor constituting the main word decoder is improved, which lengthens the life of the semiconductor memory device.

BRIEF DESCRIPTION OF THE DRAWINGS

The foregoing object, features and advantages of the present invention will become more apparent by describing in detail a preferred embodiment thereof with reference to the attached drawings in which.

DESCRIPTION OF THE PREFERRED EMBODIMENTS

Detailed Analysis of Problem

Figure 1:
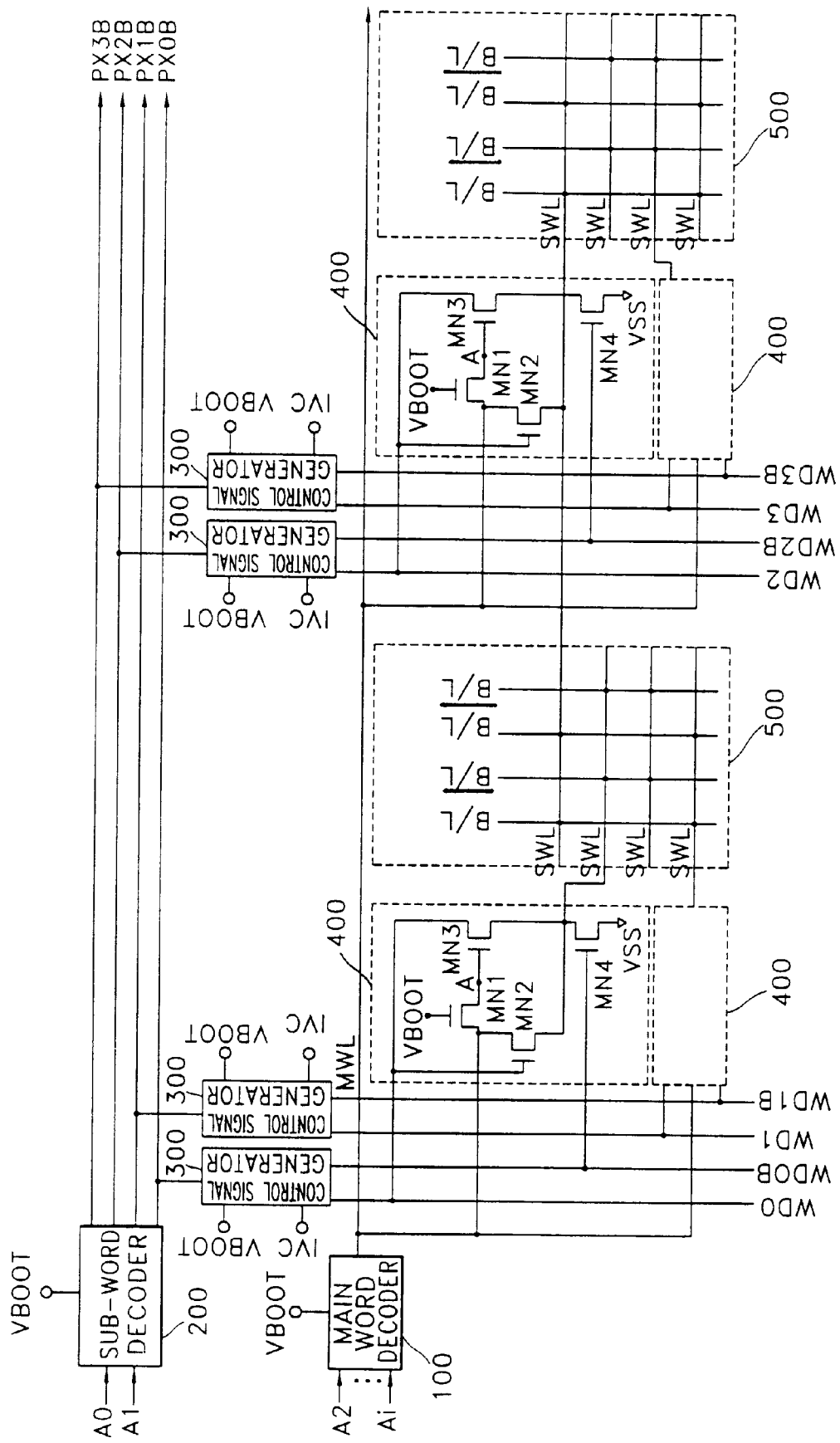
FIG. 1 is a schematic diagram of a semiconductor memory device having a conventional sub-wordline driver.
Figure 2:
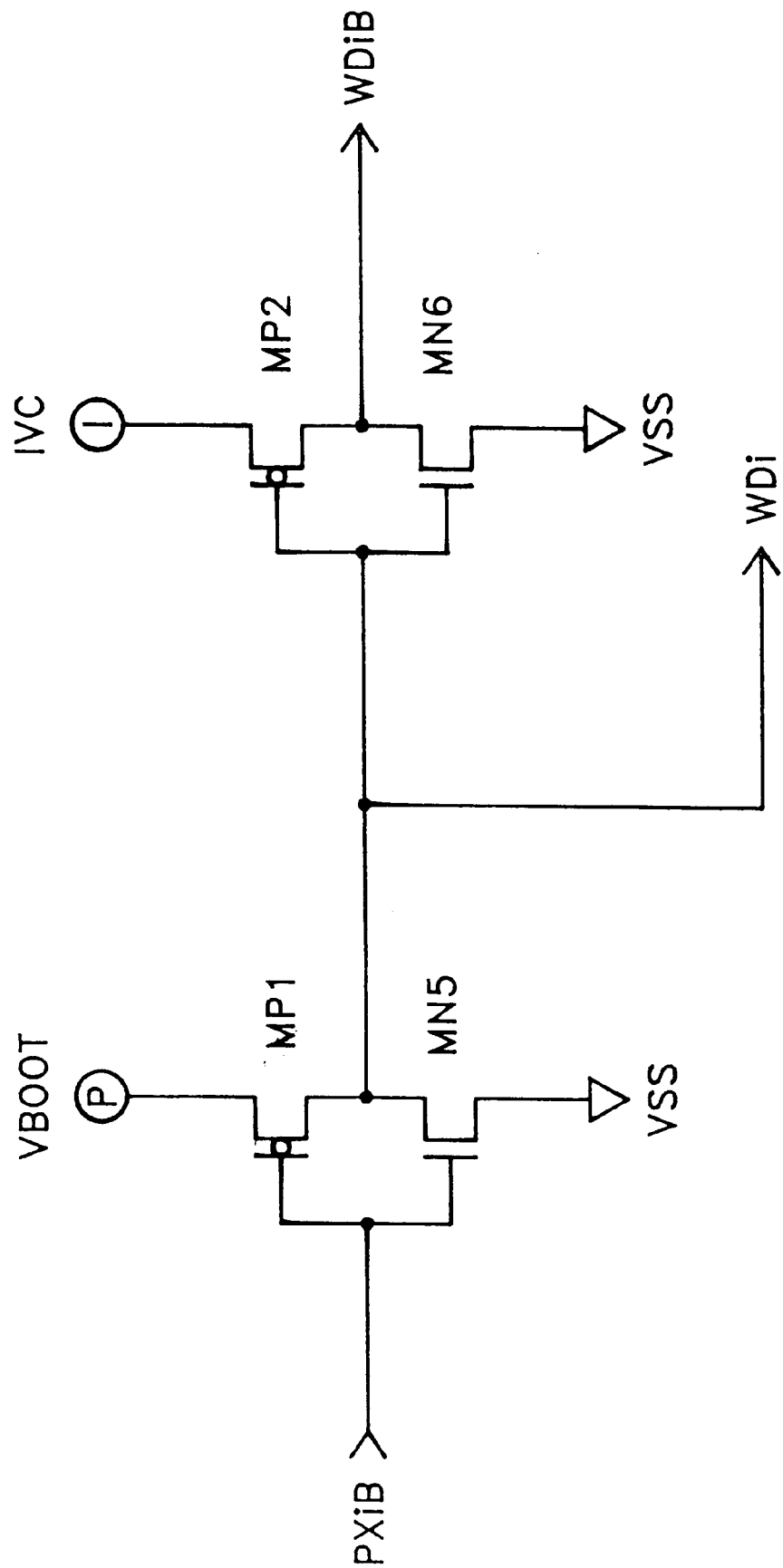
FIG. 2 is a circuit diagram of a control signal generator shown in FIG. 1.

Before explaining a preferred embodiment of the present invention, the prior art is described and analyzed with reference to FIGS. 1 and 2. In FIG. 1, circuits for driving sub-wordlines are chiefly shown.

Referring to FIG. 1, the semiconductor memory device having the conventional sub-wordline driver, for driving a sub-wordline (SWL), includes a main word decoder 100 using a boosted voltage VBOOT as a power supply voltage, a sub-word decoder 200 using the boosted voltage (VBOOT) as a power supply voltage, a plurality of control signal generators 300 using the boosted voltage VBOOT and an internal power supply voltage IVC as a power supply voltage, and a plurality of sub-wordline drivers 400.

The main word decoder 100 outputs an output signal to a main wordline MWL in response to a multitude of addresses A2~Ai. The main word decoder 100 outputs a logic "low" signal to the main wordline MWL when a memory device is in a standby state. When the memory device becomes an active state, a logic "high" signal is output to the main wordline MWL in response to the addresses A2~Ai. Since the main word decoder 100 has a boosted voltage VBOOT of the internal power supply voltage IVC as the power supply voltage, the logic "high" level output to the main wordline MWL becomes the boosted voltage level.

The sub-word decoder 200 outputs decoded signals PXiB in response to an address or a multitude of addresses. In FIG. 1, four decoded signals PX0B, PX1B, PX2B and PX3B are output in response to the two addresses A0 and A1. The decoded signals PX0B, PX1B, PX2B and PX3B all become boosted voltage (VBOOT) levels when the memory device is in a standby state. During an active state of the memory device, only one of PX0B, PX1B, PX2B and PX3B makes a transition to a logic "low" level.

The respective control signal generators 300 output WD0 & WD0B, WD1 & WD1B, WD2 & WD2B and WD3 & WD3B, respectively, in response to one of PX0B, PX1B, PX2B and PX3B. WD0, WD1, WD2 and WD3 become logic "low" levels when the memory device is in a standby state. When the memory device becomes an active state, one of WD0, WD1, WD2 and WD3 makes a transition to a boosted voltage level. WD0B, WD1B, WD2B and WD3B are complementary signals of WD0, WD1, WD2 and WD3, respectively.

The sub-wordline driver 400 includes four NMOS transistors MN1–MN4 and outputs an output signal to a sub-wordline SWL in response to the MWL, WDi and WDiB (I=0~3) signals. If the memory device becomes the active state, the main wordline MWL is enabled to the boosted voltage (VBOOT) level in response to addresses A2~Ai. Accordingly, the voltage level of a node A is elevated to VBOOT-VT, where VT is a threshold voltage level of the NMOS transistor MN1. Thereafter, if each of WDi and WDiB makes a transition to the boosted voltage VBOOT and ground voltage VSS levels, respectively, in response to the addresses A0 and A1, the voltage of the node A of the selected sub-wordline driver 400 is elevated to the voltage level of (VBOOT−VT)+VBOOT=2VBOOT−VT=2IVC+3VT (Here, it is assumed that VBOOT=IVC+2VT.) to turn the NMOS transistor MN3 on completely. Therefore, the sub-wordline SWL is enabled to the boosted voltage level which is the voltage level of WDi.

The NMOS transistor MN2 is turned on when the main wordline MWL is in a logic "low" state and WDi and WDiB are in logic "high" and logic "low" states, respectively, thereby allowing the sub-wordline SWL to make a transition to the ground voltage (VSS) level. At this time, the NMOS transistor MN4 is turned off. The MN4 transistor is turned on when WDi and WDiB are logic "low" and logic "high" states, respectively, thereby allowing the sub-wordline SWL to make a transition to the ground voltage (VSS) level. At this time, the NMOS transistor MN2 is turned off.

A reference numeral 500 represents memory cell array blocks of a predetermined number and each memory cell array block includes a plurality of memory cells. A memory cell is constituted by an access transistor and a capacitor. The gate of the access transistor is connected to the sub-wordline SWL to control the input and output of data.

FIG. 2 is a circuit diagram of a prior art control signal generator 300 shown in FIG. 1. Referring to FIG. 2, the boosted voltage VBOOT is used as the power supply voltage. Also, an inverter constituted by a PMOS transistor MP1 and an NMOS transistor MN5 receives and inverts the output signal PXIB (I=0–3) of the sub-word decoder of FIG. 1 to output a control signal WDi (I=0~3). The internal power supply voltage IVC is used as the power supply voltage, and another inverter constituted by a PMOS transistor MP2 and an NMOS transistor MN6 receives and inverts the control signal WDi to output a complementary control signal WDiB (I=0~3).

In the semiconductor memory device having the aforementioned conventional sub-wordline driver, the boosted voltage VBOOT should be used as the power supply voltage of the main word decoder 100. If the internal power supply voltage IVC is used as the power supply voltage of the main word decoder 100, the main wordline MWL becomes the internal power supply voltage level during the active state. Accordingly, when the control signal WDi is enabled to the boosted voltage level, the NMOS transistor MN2 is turned on. Thus, the sub-wordline SWL cannot maintain the level of the boosted voltage VBOOT.

In the semiconductor memory device having the aforementioned conventional sub-wordline driver, since the boosted voltage VBOOT is used as the power supply voltage of the main word decoder, the boosted voltage VBOOT is applied to the gate oxide film of the transistor constituting the main word decoder. Therefore, the intensity of the electric field applied to both ends of the gate oxide film of the transistor is increased. Accordingly, the reliability of the gate oxide film is lowered.

A preferred embodiment of the present invention will now be described in detail with reference to FIGS. 3–6.

Detailed Description of Preferred Embodiment

Figure 3:
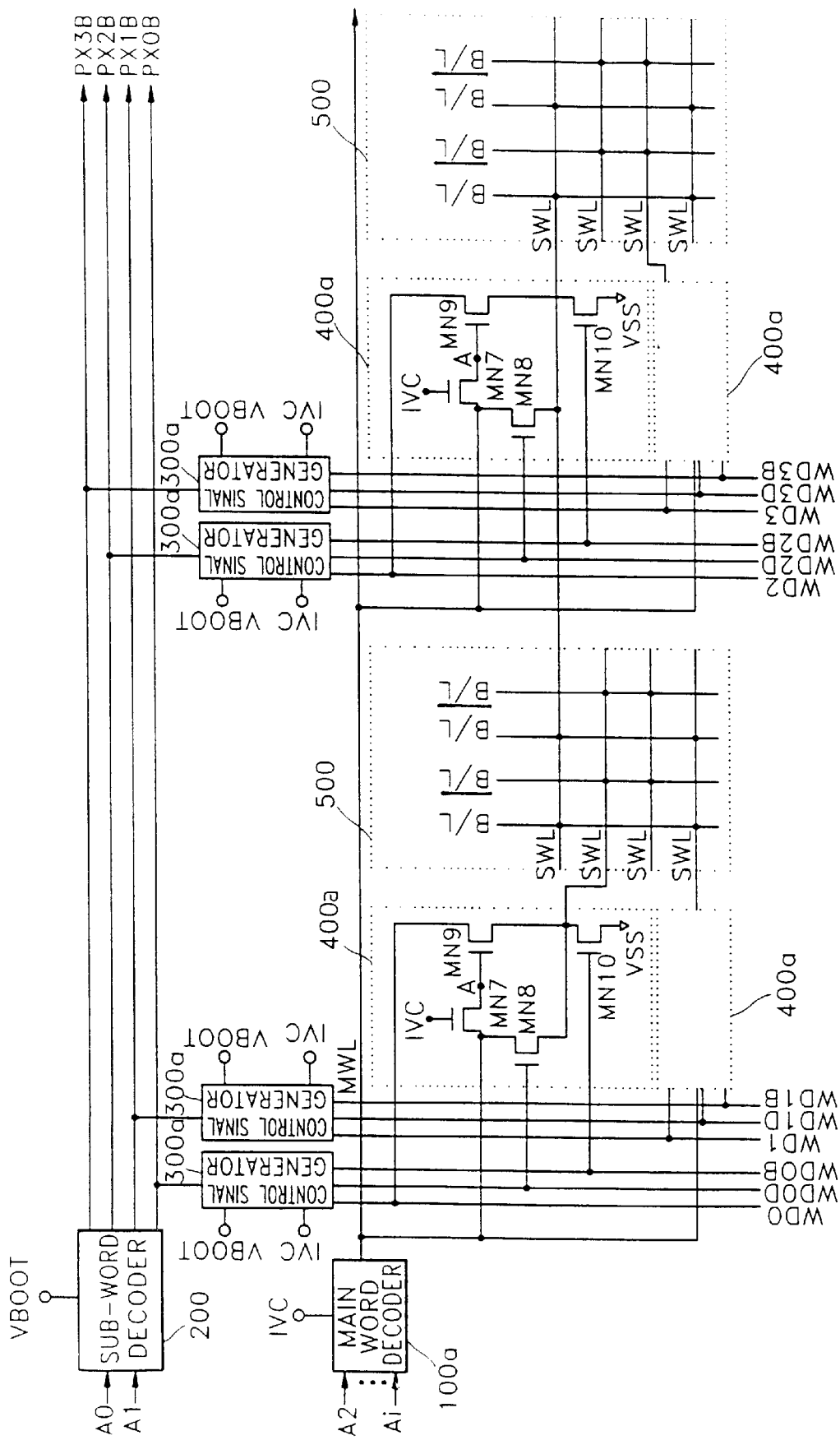
FIG. 3 is a schematic diagram of a semiconductor memory device having a sub-wordline driver according to an embodiment of the present invention.

FIG. 3 is a schematic diagram of a semiconductor memory device having a sub-wordline driver according to an embodiment of the present invention, in which circuits for driving sub-wordlines are chiefly shown and the same elements as those in FIG. 1 are designated by the same reference numerals and characters.

Referring to FIG. 3, the semiconductor memory device having the sub-wordline driver according to the present invention, for driving a sub-wordline (SWL), includes a main word decoder 100a using an internal power supply voltage (IVC) as a power supply voltage, a sub-word decoder 200 using a boosted voltage (VBOOT) as a power supply voltage, a plurality of control signal generators 300a using the boosted voltage VBOOT and the internal power supply voltage IVC as a power supply voltage, and a plurality of sub-wordline drivers 400a.

Referring to FIG. 3, the connection of transistors of the sub-wordline drivers 400a and first, second and third control signals WDiD, WDi and WDiB (I=0~3) which are output from the control signal generator 300a are different from those of the prior art shown in FIG. 1. Accordingly, the present invention shown in FIG. 3 is different from the prior art shown in FIG. 1 in that a non-boosted voltage, i.e., an internal power supply voltage (IVC), is used as the power supply voltage of the main word decoder 100a.

The sub-wordline driver 400a includes an NMOS transistor switching means MN8 whose source and drain are connected to the main wordline MWL which is the output of the main word decoder 100a and to the sub-wordline SWL, respectively, and whose gate is connected to the first control signal WDiD (I=0~3). A first NMOS transistor MN7 whose source is connected to the main wordline and its drain connected to node A has its gate is connected to the internal power supply voltage IVC. A second NMOS transistor MN9 has its source connected to the second control signal WDi (I=0~3), its gate is connected to the drain of the first NMOS transistor MN7 at node A and its drain is connected to the sub-wordline SWL. A third NMOS transistor MN10 has its drain connected to the sub-wordline SWL, its gate connected to the third control signal WDiB (I=0~3) and its source connected to the ground voltage VSS. Here, the gate of the first NMOS transistor MN7 may be connected to an external power supply voltage VCC which is higher than the internal power supply voltage IVC.

Figure 4:
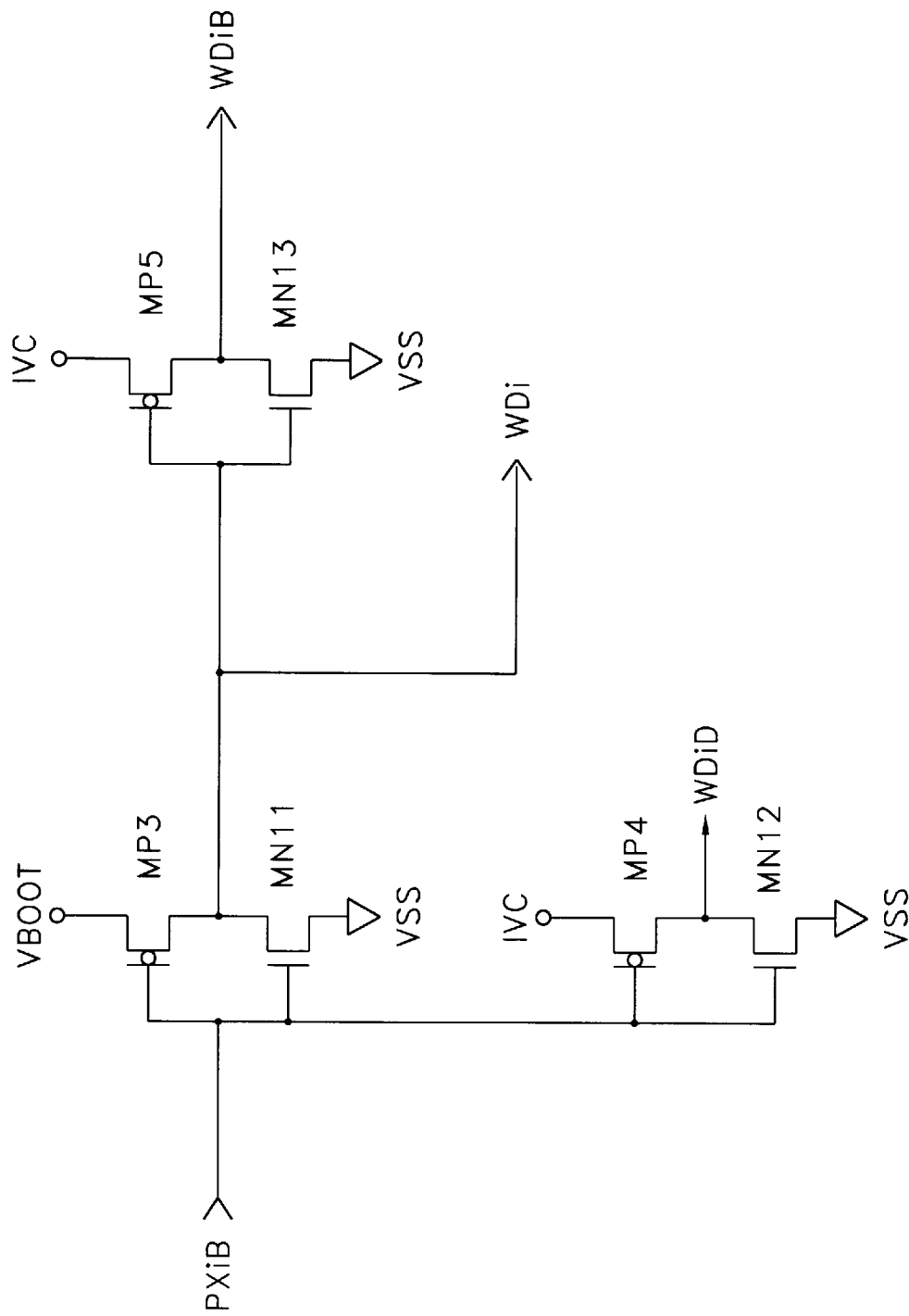
FIG. 4 is a circuit diagram of a first example of the control signal generator shown in FIG. 3.

The first, second and third control signals WDiD, WDi and WDiB are output signals of the control signal generators 300a. FIG. 4 shows a first example of a control signal generator 300a shown in FIG. 3.

Referring to FIG. 4, an inverter using the internal power supply voltage minus the threshold voltage (IVC−VT) as the power supply voltage and constituted by a PMOS transistor MP4 and an NMOS transistor MN12 receives and inverts the address decoding signals PXiB (I=0~3) output from the sub-word decoder 200 of FIG. 3 to output the first control signal WDiD (I=0~3).

Also, an inverter using the boosted voltage VBOOT as the power supply voltage and constituted by a PMOS transistor MP3 and an NMOS transistor MN11 receives and inverts the address decoding signals PXiB to output the second control signals WDi (I=0~3). Further, an inverter using the internal power supply voltage IVC as the power supply voltage and constituted by a PMOS transistor MP5 and an NMOS transistor MN13 receives and inverts the second control signals WDi to output the third control signals WDiB.

Therefore, the logic "high" voltage level of the first control signal WDiD becomes equal to the internal power supply voltage minus the threshold voltage (IVC−VT) level, and the logic "high" voltage level of the second control signal WDi becomes equal to the boosted voltage (VBOOT) level. Also, the logic "high" level of the third control signal WDIB becomes equal to the internal power supply voltage (IVC) level.

Referring to FIGS. 3 and 4, the operation of the sub-wordline driver adopted to the present invention will now be described.

If the semiconductor memory device becomes an active state, the main wordline MWL is enabled to the internal power supply voltage level in response to the addresses A2~Ai input to the main word decoder 100a Accordingly, the voltage of the node A of the sub-wordline driver 400a is increased to the voltage level of IVC−VT. VT is a threshold voltage of the first NMOS transistor MN7. Then, one of the first control signals WDiD, one of the second control signals WDi and one of the third control signals WDiB make a transition to the internal power supply voltage (IVC) level, the boosted voltage (VBOOT) level and the ground voltage (VSS) level, respectively, in response to the addresses A0 and A1 input to the sub-word decoder 200. Accordingly, the NMOS transistor MN8 and NMOS transistor MN10 are turned off. The voltage of the node A is increased to (IVC−VT)+VBOOT=(IVC−VT)+(IVC+2VT)=2IVC+VT to turn on the second NMOS transistor MN9 completely. Thus, the sub-wordline SWL is enabled to the boosted voltage level which is the voltage level of the second control signal WDi.

Particularly, in the sub-wordline driver 400a adapted to the present invention, since the gate of the NMOS transistor switching means MN8 is connected to the first control signal WDiD in which a logic "high" voltage level is the internal power supply voltage level, the NMOS transistor MN8 is turned off even when the main wordline MWL is at the internal power supply voltage level rather than the boosted voltage level. Thus, the internal power supply voltage IVC can be used as the power supply voltage of the main word decoder 100a, by which the problems of the prior art can be solved.

If the semiconductor memory device becomes a standby state, the main wordline MWL becomes a logic "low" level. At this time, if the first, second and third control signals WDiD, WDi and WDiB are at the internal power supply voltage level, the boosted voltage level and the ground voltage level, respectively, the NMOS transistor switching means MN8 is turned on so that the sub-wordline SWL becomes a logic "low" level, i.e., a ground voltage (VSS) level. On the contrary, if the first and second control signals WDiD and WDi are at the ground voltage levels and the third control signal WDiB is at the internal power supply voltage level, respectively, the NMOS transistor MN10 is turned on so that the sub-wordline SWL becomes a ground voltage level.

Figure 5:
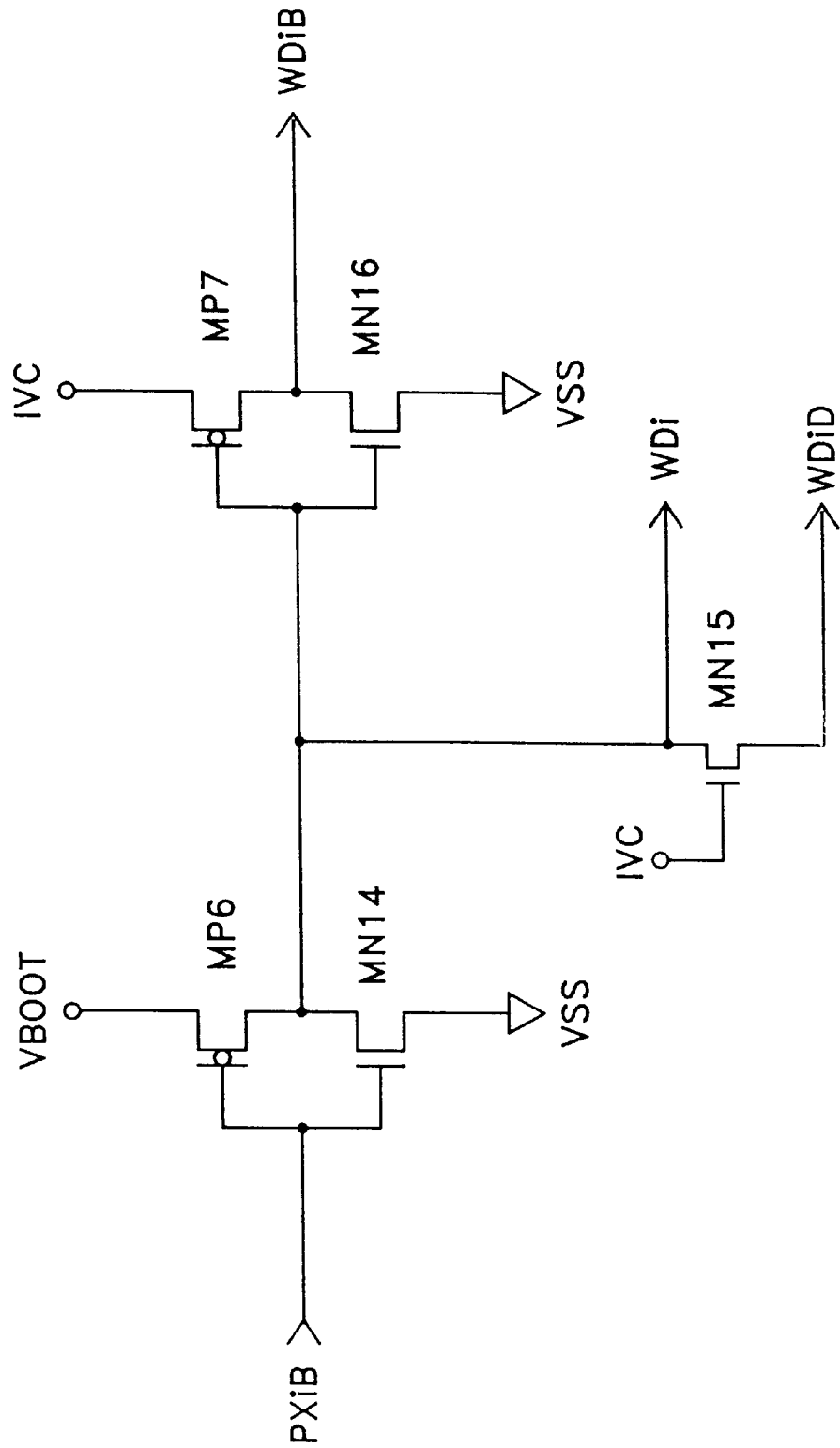
FIG. 5 is a circuit diagram of a second example of the control signal generator shown in FIG. 3.

FIG. 5 is a circuit diagram showing a second example of the control signal generator shown in FIG. 3.

Referring to FIG. 5, as in FIG. 4, an inverter using the boosted voltage VBOOT as the power supply voltage and constituted by a PMOS transistor MP6 and an NMOS transistor MN14 inverts the address decoding signal PXiB to output a second control signal WDi. Another inverter using the internal power supply voltage IVC as the power supply voltage and constituted by a PMOS transistor MP5 and an NMOS transistor MN13 inverts the second control signal WDi to output a third control signal WDiB. Also, the second control signal WDiD is transmitted via an NMOS transmission transistor MN15 whose gate is connected to the internal power supply voltage IVC, thereby outputting the first control signal WDiD.

Accordingly, the logic "high" voltage level of the first control signal WDID becomes equal to the level IVC−VT and the logic "high" voltage levels of the second and third control signals WDi and WDiB become equal to the boosted voltage level and internal power supply voltage level, respectively.

Figure 6:
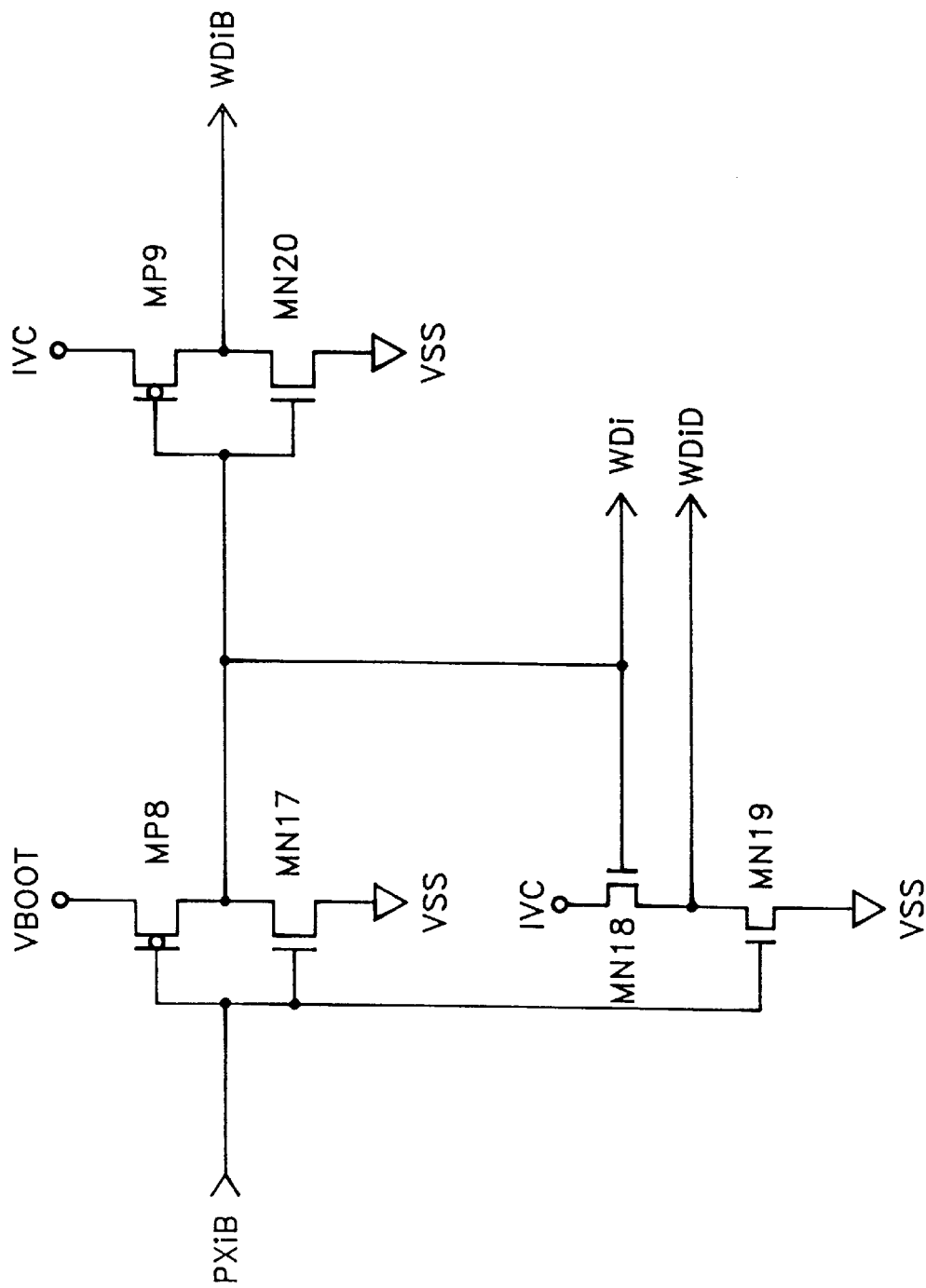
FIG. 6 is a circuit diagram of a third example of the control signal generator shown in FIG. 3.

FIG. 6 is a circuit diagram showing a third example of the control signal generator shown in FIG. 3.

Referring to FIG. 6, as in FIG. 4, an inverter using the boosted voltage VBOOT as the power supply voltage and constituted by a PMOS transistor MP8 and an NMOS transistor MN17 inverts the address decoding signal PXiB to output a second control signal WDi. Another inverter using the internal power supply voltage IVC as the power supply voltage and constituted by a PMOS transistor MP9 and an NMOS transistor MN20 inverts the second control signal WDi to output a third control signal WDiB. Also, an NMOS transistor MN18 whose gate is connected to the second control signal WDi and an NMOS transistor MN19 whose gate is connected to the address decoding signal PXIB are serially connected between the internal power supply voltage IVC and the ground voltage VSS. The first control signal WDiD is output at the connection node of the NMOS transistors MN18 and MN19.

Accordingly, the logic "high" voltage level of the first control signal WDiD becomes equal to IVC−VT and the logic "high" voltage levels of the second and third control signals WDi and WDiB become equal to the VBOOT level and the IVC level, respectively.

Therefore, in the sub-wordline driver of the semiconductor memory device according to the present invention, since the gate of NMOS transistor switching means connected between a main wordline and sub-wordline is connected to a first control signal whose logic "high" voltage level is equal to or lower than the IVC level, i.e., IVC−VT, an internal power supply voltage IVC can be used as the power supply voltage of a main word decoder, instead of a boosted voltage VBOOT. Accordingly, since the internal power supply voltage is applied to the gate oxide film of a transistor constituting the main word decoder, the electric field applied across the gate oxide film of the transistor is decreased, which prevents the reliability of the gate oxide film from being lowered.

Also, the present invention is not limited to those embodiments having described herein, but various modifications may be effected by one skilled in the art within the scope of the present invention.

What is claimed is:

1. A semiconductor memory device comprising:
   a sub-wordline and a bit line connected to a memory cell;
   a sub-wordline driver for signaling said sub-wordline; and
   a main word decoder and a sub-word decoder, for selecting said sub-wordline driver in response to an external input address signal;
   wherein said sub-wordline driver includes switching means connected between a main wordline which is an output of said main word decoder and said sub-wordline, and wherein a first control signal controls said switching means, the first control signal having a "low" level and a "high" level above the "low" level and complementary to the "low" level, and wherein the "high" level is lower than that of a signal output to said sub-wordline.

2. A semiconductor memory device as claimed in claim 1, wherein said switching means is an NMOS transistor whose gate is connected to said first control signal and whose source and drain are connected to said main wordline and said sub-wordline, respectively.

3. A semiconductor memory device as claimed in claim 1, wherein the logic "high" voltage level of said first control signal is equal to or lower than an internal power supply voltage level, and a voltage level of the signal output to said sub-wordline is a boosted voltage level higher than said internal power supply voltage level.

4. A semiconductor memory device as claimed in claim 1, including an inverter having an interval power supply voltage as a power supply voltage thereof to obtain said first control signal by inverting the output signal of said sub-word decoder.

5. A semiconductor memory device as claimed in claim 1, including an inverter having a boosted voltage higher than an internal power supply voltage as a power supply voltage coupled to produce said first control signal by inverting the output signal of said sub-word decoder and transmitting the inverted signal via an NMOS transmission transistor having a gate connected to said internal power supply voltage.

6. A semiconductor memory device as claimed in claim 1, wherein said sub-wordline driver further comprises:
   a first NMOS transistor having a source connected to said main wordline, and a gate connected to one of an external power supply voltage and an internal power supply voltage lower than said external power supply voltage;
   a second NMOS transistor having a source connected to a second control signal, a gate connected to the drain of said first NMOS transistor and a drain is connected to said sub-wordline; and
   a third NMOS transistor having a drain connected to said sub-wordline, a gate connected to a third control signal and a source connected to a ground voltage.

7. A semiconductor memory device as claimed in claim 6, including an inverter having a boosted voltage higher than said internal power supply voltage as a power supply voltage coupled to produce said second control signal by inverting the output signal of said sub-word decoder.

8. A semiconductor memory device as claimed in claim 6, including an inverter having said internal power supply voltage as a power supply voltage coupled to produce said third control signal by inverting said second control signal.

9. A semiconductor memory device comprising:
   a memory cell array connected to a plurality of sub-wordlines;
   a plurality of sub-wordline drivers for signaling sub-wordlines in response to a signal transmitted through a main wordline and first, second and third control signals;
   a plurality of control signal generators for producing said first, second and third control signals in response to a plurality of address decoding signals;
   a main word decoder using an internal power supply voltage as a power supply voltage, for signaling said main wordline in response to an address; and
   a sub-word decoder using a boosted voltage as a power supply voltage, for producing said plurality of address decoding signals in response to said address.

10. A semiconductor memory device as claimed in claim 9, wherein said sub-wordline driver comprises:
    an NMOS switching transistor having a source and drain respectively connected to said main wordline and said sub-wordline, and a gate connected to said first control signal;
    a first NMOS transistor having a source connected to said main wordline, and a gate connected to one of an external power supply voltage and said internal power supply voltage;

a second NMOS transistor having a source connected to said second control signal, a gate connected to the drain of said first NMOS transistor and a drain connected to said sub-wordline; and a third NMOS transistor having a drain connected to said sub-wordline, a gate connected to said third control signal and a source connected to a ground voltage.

11. A semiconductor memory device as claimed in claim 9, wherein said boosted voltage level is higher than said internal power supply voltage level.

12. A semiconductor memory device as claimed in claim 10, wherein said internal power supply voltage level is lower than said external power supply voltage level.

13. A semiconductor memory device as claimed in claim 9, wherein said control signal generator comprises:

a first inverter using said internal power supply voltage as a power supply voltage, coupled to invert said address decoding signal to output said first control signal;

a second inverter using said boosted voltage as a power supply voltage, coupled to invert said address decoding signal to output said second control signal; and a third inverter using said internal power supply voltage as a power supply voltage, coupled to invert said second control signal to output said third control signal.

14. A semiconductor memory device as claimed in claim 9, wherein said control signal generator comprises:

a first inverter using said boosted voltage as a power supply voltage, coupled to invert said address decoding signal to output said second control signal;

an NMOS transmission transistor coupled to transmit said second control signal in response to said internal power supply voltage applied to a gate of the NMOS transistor to output said first control signal; and a second inverter using said internal power supply voltage as a power supply voltage, coupled to invert said second control signal to output said third control signal.

15. A semiconductor memory device as claimed in claim 9, wherein said control signal generator comprises:

a first inverter using said boosted voltage as a power supply voltage, coupled to invert said address decoding signal to output said second control signal;

a first NMOS transistor having a gate connected to said second control signal and a second NMOS transistor having a gate connected to said address decoding signal, said two NMOS transistors serially connected between said internal power supply voltage and a ground voltage, for outputting said first control signal at a node of said two NMOS transistors; and a second inverter using said internal power supply voltage as a power supply voltage, coupled to invert said second control signal to output said third control signal.

* * * * *

UNITED STATES PATENT AND TRADEMARK OFFICE
CERTIFICATE OF CORRECTION

PATENT NO.    : 5,940,343
DATED         : August 17, 1999
INVENTOR(S)   : Cha et al.

It is certified that error appears in the above-identified patent and that said Letters Patent is hereby corrected as shown below:

Column 3,
Line 61, "MN1-MN4" should read -- MN1~MN4 --.

Column 4,
Line 34, "0-3" should read -- 0-3 --.

Column 6,
Line 7, "100a Accordingly" should read -- 100a. Accordingly --.

Signed and Sealed this

Fifth Day of November, 2002

Attest:

JAMES E. ROGAN
Attesting Officer          Director of the United States Patent and Trademark Office